United States Patent
Collier-Hallman

(10) Patent No.: US 10,173,718 B2
(45) Date of Patent: Jan. 8, 2019

(54) MOTOR POSITION FILTER FOR ESTIMATION OF VELOCITY USING MOVING LINEAR REGRESSION

(71) Applicant: STEERING SOLUTIONS IP HOLDING CORPORATION, Saginaw, MI (US)

(72) Inventor: Steven J. Collier-Hallman, Frankenmuth, MI (US)

(73) Assignee: STEERING SOLUTIONS IP HOLDING CORPORATION, Saginaw, MI (US)

( * ) Notice: Subject to any disclaimer, the term of this patent is extended or adjusted under 35 U.S.C. 154(b) by 598 days.

(21) Appl. No.: 14/335,098

(22) Filed: Jul. 18, 2014

(65) Prior Publication Data

US 2015/0025837 A1 Jan. 22, 2015

Related U.S. Application Data

(60) Provisional application No. 61/856,270, filed on Jul. 19, 2013.

(51) Int. Cl.
*B62D 5/04* (2006.01)
*H03M 1/12* (2006.01)
*G01P 3/64* (2006.01)

(52) U.S. Cl.
CPC ........... *B62D 5/0481* (2013.01); *B62D 5/049* (2013.01); *H03M 1/1265* (2013.01); *G01P 3/64* (2013.01)

(58) Field of Classification Search
CPC ...... G01P 3/00; G01P 3/44; G01P 3/64; G01P 11/00; G11B 20/10037; G01R 19/2509; G01R 13/0272; H03M 1/126; H03M 1/1265; B62D 5/0481; B62D 5/049
See application file for complete search history.

(56) References Cited

U.S. PATENT DOCUMENTS

| | | | | |
|---|---|---|---|---|
| 4,959,806 A * | 9/1990 | Gold | ....................... | G01P 11/00 700/304 |
| 5,010,507 A * | 4/1991 | Kenny | ................... | H03H 17/02 341/122 |
| 5,339,243 A * | 8/1994 | Matsuoka | .............. | B62D 5/049 180/446 |
| 5,802,076 A * | 9/1998 | Weigand | ................... | H04L 1/20 375/346 |
| 5,913,216 A * | 6/1999 | Kneuer | ............ | G06F 17/30982 |
| 6,597,141 B1 * | 7/2003 | Wilson-Jones | ........ | B62D 5/046 318/560 |
| 7,088,468 B1 * | 8/2006 | Thuren | ................... | G03F 7/704 257/E21.575 |
| 2005/0242765 A1* | 11/2005 | Ta | .......................... | B62D 5/046 318/799 |
| 2007/0233345 A1* | 10/2007 | Endo | ...................... | B62D 5/049 701/41 |
| 2010/0148940 A1* | 6/2010 | Gelvin | .................... | H04L 67/12 340/286.02 |

(Continued)

*Primary Examiner* — Janet L Suglo
*Assistant Examiner* — Liam R Casey
(74) *Attorney, Agent, or Firm* — Cantor Colburn LLP

(57) ABSTRACT

A method of estimating a motor velocity in an electric power steering system that includes a motor is provided. The method generates motor position data by sampling an original motor position signal at an irregular sampling rate. The method estimates a motor velocity by performing a regression analysis on the motor position data.

17 Claims, 4 Drawing Sheets

(56) References Cited

U.S. PATENT DOCUMENTS

| | | | | |
|---|---|---|---|---|
| 2011/0118962 A1* | 5/2011 | Couetoux | ............ | F02N 11/0844 |
| | | | | 701/113 |
| 2013/0054185 A1* | 2/2013 | Cwik | .................. | F02N 11/0844 |
| | | | | 702/145 |
| 2013/0308117 A1* | 11/2013 | Bridges | .................. | G01N 21/93 |
| | | | | 356/3.09 |
| 2013/0311045 A1* | 11/2013 | Tanimoto | ............ | B62D 15/0245 |
| | | | | 701/42 |
| 2014/0249724 A1* | 9/2014 | Eschtruth | ............. | B62D 5/0484 |
| | | | | 701/43 |
| 2015/0032389 A1* | 1/2015 | Hedin | .................... | G01H 1/003 |
| | | | | 702/34 |

* cited by examiner

MOTOR POSITION FILTER FOR ESTIMATION OF VELOCITY USING MOVING LINEAR REGRESSION

CROSS-REFERENCES TO RELATED APPLICATIONS

This patent application claims priority to U.S. Provisional Patent Application Ser. No. 61/856,270 filed Jul. 19, 2013 which is incorporated herein by reference in its entirety.

BACKGROUND OF THE INVENTION

Motor velocity is an important signal for electronic steering. Motor velocity may be used in the control of the motor as well as in steering related functions such as active damping and inertia compensation. In some known systems, the motor velocity signal is obtained by differentiating the motor position signal or the signals used to derive motor position with respect to time. In such systems, there may be a tradeoff between lag, resolution and noise that can be obtained by setting the period of the differentiation or filtering the signal with a low pass filter. Increasing the differentiation period improves noise and resolution but degrades lag. Moreover, filtering with a low pass filter also improves noise and resolution at the expense of lag.

Noise and resolution of the motor velocity signal are important because they may be translated into audible noise and torque disturbances in some steering systems. Additionally, lag is important because it directly affects the dynamic performance of some systems. Excess lag is often perceived as "inertia" and is not desirable.

Accordingly, it is desirable to provide for systems and methods that allow more flexibility in trading off noise, resolution, and lag.

SUMMARY OF THE INVENTION

According to one embodiment of the invention, a method of estimating a motor velocity in an electric power steering system that includes a motor is provided. The method generates motor position data by sampling an original motor position signal at an irregular sampling rate. The method estimates a motor velocity by performing a regression analysis on the motor position data.

According to another embodiment of the invention, a system comprising a control module and a power steering system that includes a motor is provided. The control module is configured to generate motor position data by sampling an original motor position signal at an irregular sampling rate. The control module is further configured to estimate a motor velocity by performing a regression analysis on the motor position data.

According to a further embodiment of the invention, a control system for estimating a motor velocity in an electric power steering system that includes a motor is provided. The control system includes a sampling module configured to generate motor position data by sampling an original motor position signal at an irregular sampling rate. The control system further includes a motor velocity estimation module configured to estimate a motor velocity by performing a regression analysis on the motor position data.

These and other advantages and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
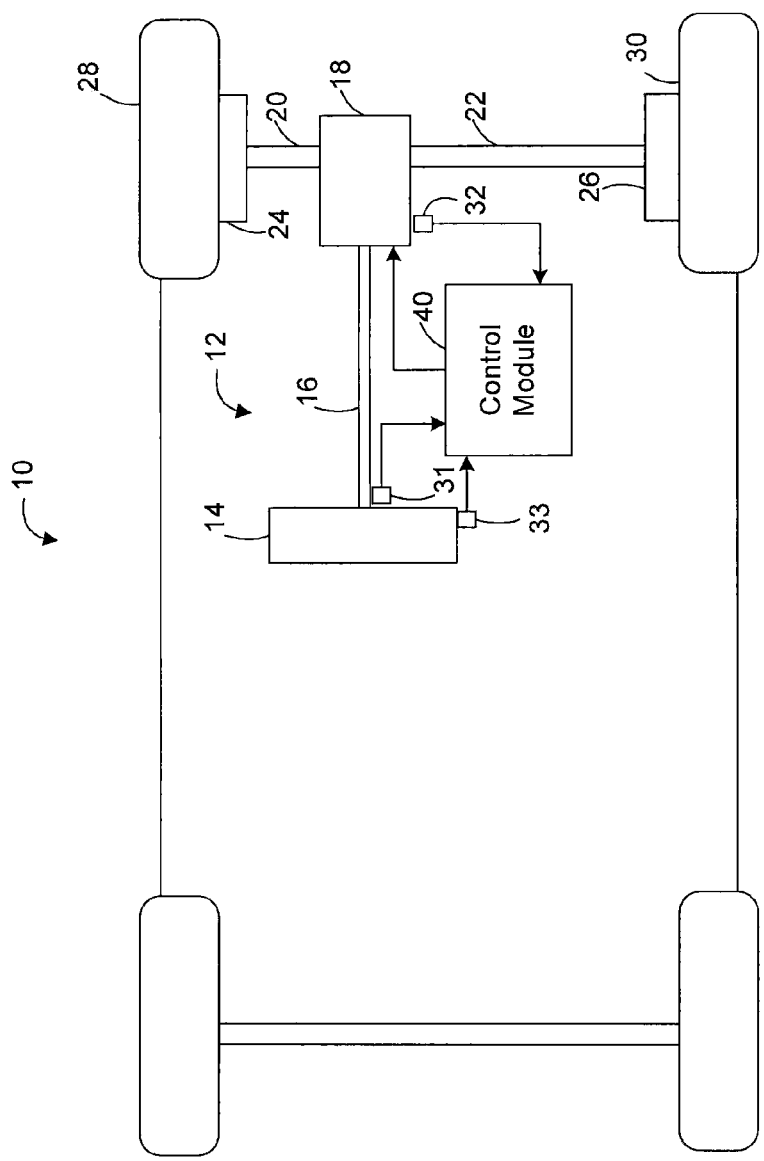
FIG. 1 depicts a block diagram of a steering system that includes a motor velocity estimation system in accordance with exemplary embodiments.

The following description is merely exemplary in nature and is not intended to limit the present disclosure, application, or uses. It should be understood that throughout the drawings, corresponding reference numerals indicate like or corresponding parts and features.

Referring now to FIG. 1, where the invention will be described with reference to specific embodiments without limiting same, an exemplary embodiment of a vehicle 10 including a steering system 12 is illustrated. In some embodiments, the steering system 12 includes a hand wheel 14 coupled to a steering shaft 16. In one exemplary embodiment, the steering system 12 is an electric power steering (EPS) system that further includes a steering assist unit 18 that couples to the steering shaft 16 of the steering system 12 and to tie rods 20, 22 of the vehicle 10. The steering assist unit 18 includes, for example, a rack and pinion steering mechanism (not shown) that may be coupled through the steering shaft 16 to a steering actuator motor and gearing (hereinafter referred to as the steering actuator). During operation, as the hand wheel 14 is turned by a vehicle operator, the motor of the steering assist unit 18 provides the assistance to move the tie rods 20, 22 which in turn moves steering knuckles 24, 26, respectively, coupled to roadway wheels 28, 30, respectively of the vehicle 10. Although an EPS system is illustrated in FIG. 1 and described herein, it is appreciated that the steering system 12 of the present disclosure can include some controlled steering systems including, but not limited to, steering systems with hydraulic configurations, and steer by wire configurations.

As shown in FIG. 1, the vehicle 10 further includes some sensors 31-33 that detect and measure observable conditions of the steering system 12 and/or of the vehicle 10. The sensors 31-33 generate sensor signals based on the observable conditions. In some embodiments, the sensors 31-33 include, for example, a motor position sensor. The motor position sensor is positioned and configured so as to periodically or continuously detect a rotational (i.e., angular) position of an output shaft driven by the motor of the steering assist unit 18 and to communicate such detected positions (i.e., information indicative of such detected positions) to the control module 40. Specifically, in some embodiments, the motor position sensor includes a sensor integrated circuit (IC) for integrated signal processing to digitize motor positions and transmit the digitized positions to controller 40.

In some embodiments, a control module 40 controls the operation of the steering system 12 and/or the vehicle 10 based on one or more of the sensor signals and further based on the motor velocity estimation systems and methods of the present disclosure. Generally speaking, the systems and methods of the present disclosure use moving linear regression as an oversampling filter technique to derive more information from the position signal, which allows more flexibility in tradeoffs between noise, resolution, and lag in calculating a motor velocity. Specifically, the systems and methods estimate a motor velocity regardless of whether the sampling rate of the motor position signal is regular or irregular.

In some cases, the commutation sampling rate of the motor position is irregular (e.g., the intervals between the samples are not uniform) because the commutation sampling rate is tied to the pulse-width modulation (PWM) frequency, which is dithered for an electro-magnetic compatibility (EMC) interference reason. In some embodiments, the motor position signal that is sampled at the commutation sampling rate is sampled again at another irregular sampling rate. In particular, the motor position signal at the commutation sampling rate is sampled again at a motor velocity sampling rate, which is an irregular sampling rate, to a pair of rolling buffers to store motor position and time information. The motor velocity sampling rate will be described further below.

The contents of the buffers and the state variables are used to estimate a motor velocity based on the slope portion of the regression calculation. Specifically, the regression calculation technique of some embodiments utilizes more than two endpoints and not all of the midpoints for calculating a slope, unlike conventional regression calculation methods that use two endpoints and all of the midpoints but discount the contribution of the midpoints to the slope. As such, the regression calculation technique of some embodiments uses more information (i.e., one pair of endpoints vs. two or more pairs of endpoints) in calculating the slope and thereby improves resolution and decreases noise for a given lag.

Figure 2:
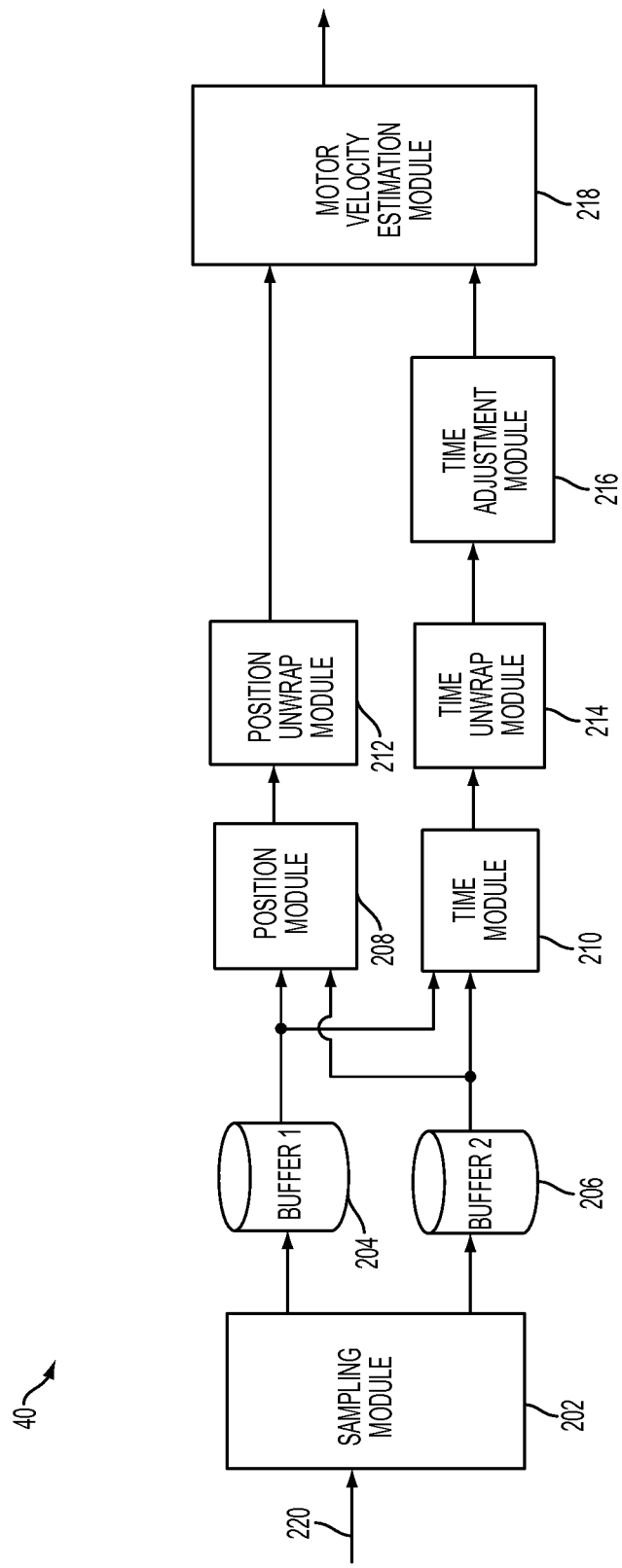
FIG. 2 depicts a dataflow diagram illustrating a motor velocity estimation system in accordance with exemplary embodiments.

Referring now to FIG. 2 where a dataflow diagram illustrates exemplary embodiments of the control module 40 of FIG. 1 used to control the steering system 12 and/or the vehicle 10 of FIG. 1. In some embodiments, the control module 40 may include one or more sub-modules and datastores (e.g., buffers). As used herein the terms module and sub-module refer to an application specific integrated circuit (ASIC), an electronic circuit, a processor (shared, dedicated, or group) and memory that executes one or more software or firmware programs, a combinational logic circuit, and/or other suitable components that provide the described functionality. The sub-modules and datastores shown in FIG. 2 may be combined and/or further partitioned. The sub-modules shown in FIG. 2 may be implemented as a single control module 40 (as shown) or multiple control modules (not shown). Inputs to the control module 40 may be generated from the sensors of the vehicle 10 (FIG. 1), may be modeled within the control module 40 (e.g., by other sub-modules (not shown)), may be received from other control modules (not shown), and/or may be predefined. In some embodiments, the control module 40 includes a sampling module 202, buffers 204 and 206, a position module 208, a time module 210, a position unwrap module 212, a time unwrap module 214, a time adjustment module 216, and a motor velocity estimation module 218.

The sampling module 202 receives a motor position signal 220. In some embodiments, the motor position signal 220 is digitized motor position data from the motor position sensor (e.g., one of the sensors 31-33 of FIG. 1). In some embodiments, the motor position sensor may directly supply the motor position signal 220 to the sampling module 202. In other embodiments, other sub-module (not shown) of the control module 40 or a module (not shown) other than the control module 40 receives a continuous motor position signal from the motor position sensor and digitizes the signal into the motor position signal 220. The motor position signal 220 is sampled at the commutation sampling rate, which may vary due to the modulation and dithering as described above. For example, the commutation sampling rate for a particular motor may vary between 56- and 71-microsecond (µs) rates. As can be recognized, however, the ranges of the commutation sampling rates for different motors depend on different configurations of the different motors. Each sample in the motor position signal 220 includes a position value and a corresponding time value that indicates the instance in time at which the position value was sampled.

The sampling module 202 samples the motor position signal 220 at an irregular sampling rate, which is referred to as the motor velocity sampling rate in this disclosure. Specifically, in some embodiments, the sampling module 202 selects a plurality of consecutive samples from the digitized motor position data of the motor position signal 220, at an interval that is substantially larger (e.g., an order of magnitude larger) than the sampling rate of the motor position signal 220. For instance, the sampling module 202 selects eight consecutive samples of the motor position signal 220 at about every two milliseconds (ms). In some embodiments, the sampling module 202 selects pluralities of consecutive samples from the digitized motor position data of the motor position signal 220 by skipping a larger plurality of samples between the pluralities of consecutive samples. For instance, the sampling module 202 selects eight consecutive samples of the motor position signal 220, skips 32 consecutive samples and then selects the next eight consecutive samples, and so forth. The motor velocity sampling rate is thus an irregular sampling rate because each group of consecutive samples of the motor position signal 220, which is generated at an irregular sampling rate already, is separated with another group of consecutive samples by a time gap for the skipped samples. That is, the last sample of one group and the first sample of the next group apart by the time gap, which is about 1600 µs in the above example, but this first sample is separated with the next sample by a time gap that is much smaller than the gap between the groups, which is about 50 µs in the above example.

Figure 3:
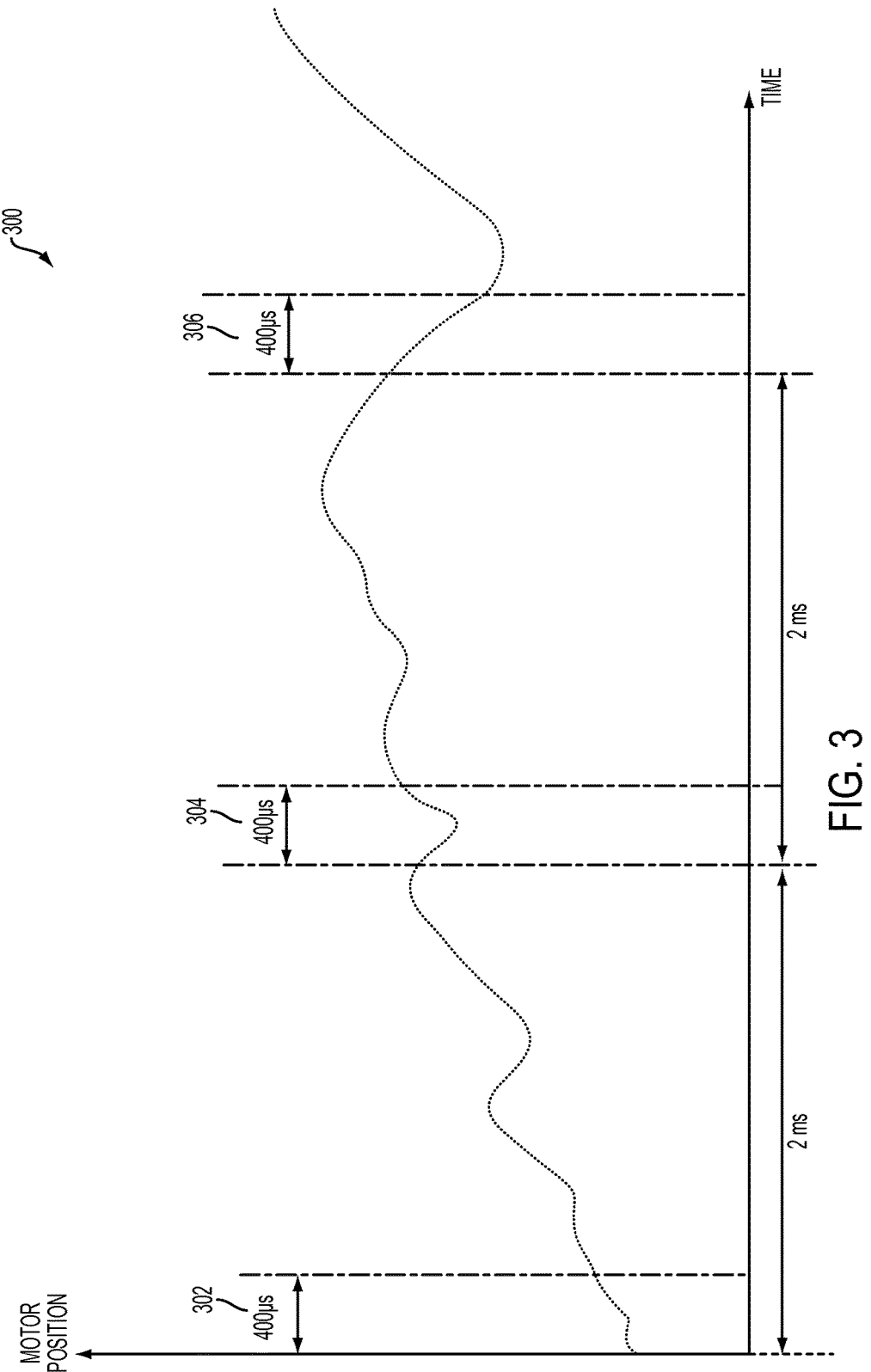
FIG. 3 depicts a graph showing plots of motor position values in accordance with exemplary embodiments.
Figure 4:
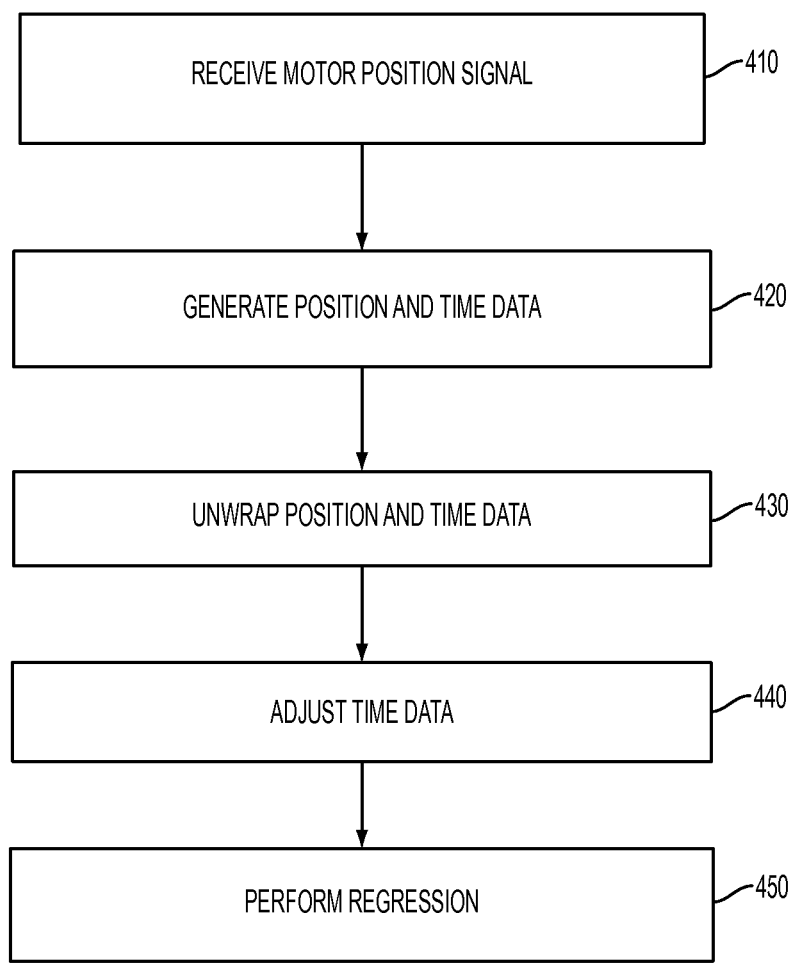
FIG. 4 is flow diagram illustrating a motor velocity estimation method in accordance with exemplary embodiments.

FIG. 3 illustrates a graph 300 showing an example of the plots of the motor position signal 220 and the samples selected by the sampling module 202. As shown in FIG. 3, each of the 400-µs strips 302, 304 and 306 includes plots of eight consecutive samples at a commutation sampling rate (e.g., an average of 50-µs apart) selected by the sampling module 200. The sampling module 200 selects the samples at about a 2-ms (i.e., 2000-µs) interval (or by skipping 32 consecutive samples in between the groups of eight samples). The samples plotted in between the 400-µs strips are not selected by the sampling module 200. As such, the sampling module 200 samples the motor position signal 220 at an irregular sampling rate. It is to be noted that not all position values are plotted in the graph and the graph is not drawn to scale in FIG. 3.

Referring back to FIG. 2, the sampling module 202 stores the samples selected from the motor position signal 220 in the buffer 204. In some embodiments, the buffer 204 is a rolling buffer for storing only a limited number (e.g., eight) of samples at a time. That is, the buffer 204 stores the samples selected by the sampling module 202 for one interval.

In some embodiments, the sampling module 202 stores in the buffer 206 a copy of the samples stored in the buffer 204 such that the samples stored in the buffer 206 is older than the samples stored in the buffer 204 by an interval. For instance, when the position values in the 400-µs strip 306 shown in FIG. 3 is being selected and stored in the buffer 204, the position values in the 400-µs strip 304, which are older than the position values in the 400-µs strip 306 being stored in the buffer 204 by an interval (i.e., by 2 ms), are being stored in the buffer 206. In some embodiments, the buffer 206, like the buffer 204, is a rolling buffer for storing only the samples selected by the sampling module 202 for one interval.

The position module 208 combines selected and stored samples from the buffers 204 and 206 to generate an array of position values. Specifically, in some embodiments, the position module 208 takes a first plurality of consecutive samples from the buffer 204 and a second plurality of consecutive samples from the buffer 206. As described above, the second plurality of consecutive samples are older than the first plurality of consecutive samples by an interval. For instance, the position module 208 takes the position values in the 400-µs strip 306 from the buffer 204 and the position values in the 400-µs strip 304 from the buffer 206. As such, the array of position values generated by the position module 208 includes two times of a number of samples stored in each of the buffers 204 and 206. For instance, when the sampling module 202 selects eight samples for one interval, the array of position values generated by the position module 208 includes 16 position values.

The position unwrap module 212 receives the array of position values from the position module 208 and "unwraps" any of the position values that needs to be unwrapped. Unwrapping is a process that converts a position value that is "wrapped" to a value that is within an allowed range of values. Because a position value is an angle value with respect to a reference angle (e.g., zero), the motor position sensor in some cases "wraps" the position value if the position value goes out of the allowed range (e.g., 0 to $2\pi$ radians or 0 to 360 degrees). For instance, when the shaft of the motor rotates from 359 degrees to 361 degrees with respect to the reference angle (e.g., zero degree), the motor position sensor may wrap 361 degrees to 1 degree. The position unwrap module 212 unwraps a position value such that a change between two consecutive position values is smoother. That is, in the above example, the position unwrap module 212 converts a value of 1 degree that comes after a value of 359 degree to a value of 361 degree.

As an example of an unwrapping technique, the position unwrap module 212 subtracts the oldest position value from each of the position values in the array of position values and then compares the results of the subtractions with plus or minus $\pi$ radians (or 180 or –180 degrees). $2\pi$ radians (or 360 degrees) are then added or subtracted from the subtraction results, if necessary, to unwrap. This technique assumes that the sample rate is fast enough such that the shaft of the motor moves less than $\pi$ radians (or 180 degrees) in one sample period (i.e., time gap between two consecutive samples, e.g., 2 µs) when the shaft of the motor is rotating at a maximum speed. The position unwrap module 212 sends the array of position values that are unwrapped as necessary to the motor velocity estimation module 215.

The time module 210 combines time values corresponding to the array of the position values generated by the position value 212 to generate an array of time values. Therefore, the array of time values generated by the time module 210 also includes two times of a number of samples stored in each of the buffers 204 and 206.

The time unwrap module 214 receives the array of time values from the time module 210 and unwraps any of the time values that needs to be unwrapped. Because a space for storing a time value has a limited number of bits (e.g., 32 bits), the space may wrap the time value if the time value goes out of a possible range of values that may be stored in the space (e.g., 0 through 4,294,967,295 for 32 bits). For instance, when the time elapses from 4,294,967,295 µs 4,294,967,345 µs with respect to a reference time instance value (e.g., zero), the motor position sensor may wrap 4,294,967,345 µs to 50 µs. The time unwrap module 214 unwraps a time value such that a change between two consecutive time values is smoother. That is, in the above example, the time unwrap module 214 converts a value of 50 µs that comes after a value of 4,294,967,295 µs to a value of 4,294,967,345 µs.

As an example of an unwrapping technique, the time unwrap module 214 may employ an unwrapping technique that subtracts the oldest time value from each of the time values in the array of time values using fixed point math. This technique assumes that the space for storing a time value has a sufficient size that the time value is not rapped more than once in any sample period. The time unwrap module 214 sends the array of time values that are unwrapped as necessary to the time adjustment module 216.

The time adjustment module 216 receives the array of time values from the time unwrap module 214 and further adjusts the time values in the array in order to simplify calculation of a motor velocity by the motor velocity estimation module 218. In particular, the time adjustment module 216 calculates an average or a mean value of the time values in the array and subtracts the average value from each of the time values in the array. The time adjustment module 215 sends the array of adjusted time values to the motor velocity estimation module 218.

The motor velocity estimation module 218 estimates a motor velocity based on the array of position values received from the position unwrap module 212 and the array of time values received from the time adjustment module 216. In some embodiments, the adjustment to the time values by the time adjustment module 216 may be skipped and thus the motor velocity estimation module 218 directly receives the array of time values from the time unwrap module 214.

In some embodiments, the motor velocity estimation module 218 estimates a motor velocity using the following equation:

$$\text{Slope} = \frac{\sum_{i=1}^{N} \text{position\_value}_i \times \text{time\_value}_i}{\sum_{i=1}^{N} \text{time\_value}_i^2} \qquad \text{Equation (1)}$$

where position_value represents a position value in the array of position values; time_value represents a time value in the array of time values; N represents a number of position values in the array of position values and a number of time values in the array of time values; and Slope represents an estimated motor velocity.

In some embodiments, the sampling module 202 receives another motor position signal (not shown) from another motor position sensor (e.g., one of the sensors 31-33 of FIG. 1) in addition to the motor position signal 220. This motor position sensor is a redundant sensor that produces and supplies digitized motor position data to the sampling module 202. That is, the motor position sensor that sends the motor position signal 220 is the primary sensor and this redundant sensor is a secondary sensor. In these embodiments, the sampling module 202 does not sample the secondary motor position signal at an irregular rate. Rather, the sampling module 202 selects all of the samples in the digitized motor position data of the second motor position signal. The sampling module 202 stores the samples to the buffers 204 and 206. In these embodiments, the samples from the secondary motor position signal stored in the buffer 206 are older than the samples of the secondary motor position signal stored in the buffer 204 by one or more sampling periods (e.g., a multiple of 50-µs).

In some embodiments, the position module 208 does not do anything on the samples of the secondary motor position signal but passing the position values to the position unwrap module 212. The position unwrap module 212 unwraps any position value of the secondary motor position signal as necessary and passes the position values to the motor velocity estimation module 218. In some embodiments, the time module 210 does not do anything on the samples of the secondary motor position signal but passing the time values directly to the motor velocity estimation module 218, skipping the time unwrap module 214 and the time adjustment module 216.

The motor velocity estimation module 218 estimates a motor velocity based on the position values and the corresponding time values of the secondary motor position signal. Specifically, in some embodiments, the motor velocity estimation module 218 uses the following equation:

$$\text{Slope} = \frac{\text{position\_value}_j - \text{position\_value}_{j-k}}{\text{time\_value}_j - \text{time\_value}_{j-k}} \qquad \text{Equation (2)}$$

where position_value$_j$ represents the most recent position value; position_value$_{j-k}$ represents a position value that is older than position_value$_j$ by k sampling period(s); and time_value$_j$ and time_value$_{j-k}$ represents the corresponding time values; and Slope represents a motor velocity calculated based on the samples of the secondary motor position signal.

In some embodiments, other sub-module (not shown) of the control module 40 or a module (not shown) other than the control module 40 may use the motor velocity estimated based on the secondary motor position signal when the primary motor position sensor fails, or it may compare the motor velocity estimated based on the primary motor position signal and the motor velocity estimated based on the secondary motor position signal to determine whether one of the primary and secondary position sensors failed.

Referring now to FIG. 3, a flow diagram illustrates a motor velocity estimation method that may be performed by the control module 40 of FIGS. 1 and 2. As can be appreciated in light of the disclosure, the order of operation within the method is not limited to the sequential execution as illustrated in FIG. 3, but may be performed in one or more varying orders as applicable and in accordance with the present disclosure.

In one example, the method at block 410 receives a motor position signal originating from a motor position sensor (e.g., one of the sensors 31-33 of FIG. 1). In some embodiments, the motor position signal is sampled at a regular sampling rate. At block 420, the method generates an array of position values and an array of corresponding time values by sampling the motor position signal at an irregular sampling rate.

At block 430, the method unwraps the position values in the array of position values and the time values in the array of time values as necessary. That is, the method determines that one of the position values is to be unwrapped and unwraps a motor position value. The method also determines that one of the time values is to be unwrapped and unwraps the time value.

At block 440, the method optionally adjusts the time values in the array of time values. Specifically, the method determines an average value of the time values in the array of time values and subtracts the average value from each of the time values in the array.

At block 450, the method estimates a motor velocity by performing a regression analysis on a plurality of position values in the array of position values and a plurality of time values in the array of time values. Specifically, in some embodiments, the method generates a first sum of all products of the motor position values and the corresponding time values. The method also generates a second sum of all of squared time values. The method then generates an estimated motor velocity by dividing the first sum by the second sum.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while some embodiments of the invention have been described, it is to be understood that aspects of the invention may include only some of the described embodiments. Accordingly, the invention is not to be seen as limited by the foregoing description.

Having thus described the invention, it is claimed:

1. A method of adjusting steering system operation by estimating a motor velocity in an electric power steering system that includes a motor, comprising:
    generating motor position data by sampling an original motor position signal of the motor of the electric power steering system at an irregular sampling rate, the original motor position signal being obtained by a first position sensor, the generated motor position data includes a plurality of motor position values and a plurality of corresponding time values, wherein the generating comprises:
        selecting a first plurality of consecutive motor position values from the original motor position signal from the first position sensor, each pair of consecutive motor position values from the first plurality of motor position values has a first predetermined time-gap, a number of the consecutive motor position values selected based on a capacity of a first rolling buffer in which the selected first plurality of consecutive motor position values is stored;
        selecting a second plurality of consecutive motor position values from the original motor position signal from the first position sensor, each pair of consecutive motor position values from the second plurality of motor position values has the first predetermined time-gap, a number of the consecutive motor position values selected based on a capacity of a second rolling buffer in which the selected second plurality of consecutive motor position values is stored; and the second plurality of motor position values is sampled successively after the first plurality of motor position values, the temporally first motor position value from the first plurality of motor position values and the temporally first motor position value from the second plurality of motor position value having a second predetermined time-gap, distinct from the first predetermined time-gap;

estimating a motor velocity of the motor of the electric power steering system using the motor position data sampled at the irregular sampling rate and stored in the first rolling buffer and in the second rolling buffer to compute $$\frac{\sum_{i=1}^{N} position_i \times time_i}{\sum_{i=1}^{N} time_i^2},$$

where $position_i$ is a motor position value from the irregularly sampled motor position data, and $time_i$ is corresponding time value; and adjusting steering operation of the electric power steering system according to the estimated motor velocity by causing the motor to generate assistance torque using the estimated motor velocity.

2. The method of claim 1, wherein the original motor position signal is generated by sampling shaft positions of the motor at a predetermined sampling rate.

3. The method of claim 1, further comprising
determining that one of the plurality of motor position values is to be unwrapped; and
unwrapping the motor position value.

4. The method of claim 1, further comprising:
determining that one of the plurality of the time values is to be unwrapped; and
unwrapping the time value.

5. The method of claim 1, further comprising adjusting the time values by subtracting an average of the time values from each of the time values.

6. A system comprising:
a power steering system that includes a motor; and
a control module configured to:
generate motor position data by sampling an original motor position signal of the motor at an irregular sampling rate, the original motor position signal being obtained by a first position sensor, the generated motor position data includes a plurality of motor position values and a plurality of corresponding time values, the generating comprising:
selecting a first plurality of consecutive motor position values from the original motor position signal from the first position sensor, each pair of consecutive motor position values from the first plurality of motor position values has a first predetermined time-gap, a number of the consecutive motor position values selected based on a capacity of a first rolling buffer in which the selected first plurality of consecutive motor position values is stored; and
selecting a second plurality of consecutive motor position values from the original motor position signal from the first position sensor, each pair of consecutive motor position values from the second plurality of motor position values has the first predetermined time-gap, a number of the consecutive motor position values selected based on a capacity of a second rolling buffer in which the selected second plurality of consecutive motor position values is stored, the second plurality of motor position values is sampled successively after the first plurality of motor position values, the temporally first motor position value from the first plurality of motor position values and the temporally first motor position value from the second plurality of motor position value having a second predetermined time-gap, distinct from the first predetermined time-gap;

estimate a motor velocity of the motor using the motor position data that is sampled at the irregular sampling rate and stored in the first rolling buffer and in the second rolling buffer to compute $$\frac{\sum_{i=1}^{N} position_i \times time_i}{\sum_{i=1}^{N} time_i^2},$$

where $position_i$ is a motor position value from the motor position data, and $time_i$ is corresponding time value; and adjust a steering operation of the power steering system according to the estimated motor velocity by causing the motor to generate assistance torque using the estimated motor velocity.

7. The system of claim 6, wherein the original motor position signal is generated by sampling shaft positions of the motor at a predetermined sampling rate.

8. The system of claim 6, wherein the control module is further configured to:
determine that one of the motor position values is to be unwrapped; and
unwrap the motor position value.

9. The system of claim 6, wherein the control module is further configured to:
determine that one of the time values is to be unwrapped; and
unwrap the time value.

10. The system of claim 6, wherein the control module is further configured to adjust the time values by subtracting an average of the time values from each of the time values.

11. A control system for estimating a motor velocity in an electric power steering system that includes a motor, comprising:
a sampling module configured to generate motor position data by sampling an original motor position signal of the motor at an irregular sampling rate, the original motor position signal being obtained by a first position sensor, the generated motor position data includes a plurality of motor position values and a plurality of corresponding time values, wherein the generating comprising:
selecting a first plurality of consecutive motor position values from the original motor position signal from the first position sensor, each pair of consecutive motor position values from the first plurality of motor position values has a first predetermined time-gap, a number of the consecutive motor position values selected based on a capacity of a first rolling buffer in which the selected first plurality of consecutive motor position values is stored; and selecting a second plurality of consecutive motor position values from the original motor position signal from the first position sensor, each pair of consecutive motor position values from the second plurality of motor position values has the first predetermined time-gap, a number of the consecutive motor position values selected based on a capacity of a second rolling buffer in which the selected second plurality of consecutive motor position values is stored, the second plurality of motor position values is sampled successively after the first plurality of motor position values, the temporally first motor position value from the first plurality of motor position values and the temporally first motor position value from the second plurality of motor position value having a second predetermined time-gap, distinct from the first predetermined time-gap;

a motor velocity estimation module configured to estimate a motor velocity of the motor of the electric power steering system using the motor position data sampled at the irregular sampling rate and stored in the first rolling buffer and in the second rolling buffer to compute $$\frac{\sum_{i=1}^{N} \text{position}_i \times \text{time}_i}{\sum_{i=1}^{N} \text{time}_i^2},$$

where $\text{position}_i$ is a motor position value from the motor position data, and $\text{time}_i$ is corresponding time value; and a control module configured to adjust a steering operation of the electric power steering system according to the estimated motor velocity by causing the motor to generate assistance torque using the estimated motor velocity.

12. The control system of claim 11, wherein the original motor position signal is generated by sampling shaft positions of the motor at a predetermined sampling rate.

13. The control system of claim 11, further comprising:
a position unwrap module configured to:
determine that one of the motor position values is to be unwrapped; and
unwrap the motor position value; and
a time unwrap module configured to:
determine that one of the time values is to be unwrapped; and
unwrap the time value when the time value is determined to be unwrapped.

14. The control system of claim 11, further comprising a time adjustment module configured to adjust the time values by subtracting an average of the time values from each of the time values.

15. The system of claim 6, wherein the control module is further configured to:
receive, from a second motor position sensor, a secondary motor position signal of the motor that is sampled at a regular rate;
estimate a second motor velocity of the motor using the secondary motor position signal that is sampled at a regular rate by computing $(\text{position}_j - \text{position}_{j-k})/(\text{time}_j - \text{time}_{j-k})$, where $\text{position}_j$ is a motor position value from the secondary motor position signal, $\text{time}_j$ is corresponding time value, $\text{position}_{j-k}$ is an older motor position value from the secondary motor position signal, and $\text{time}_{j-k}$ is corresponding time value; and
detecting an error in the first motor position sensor by comparing the motor velocity and the second motor velocity.

16. The control system of claim 11, wherein the generating further comprises:
receiving, from a second motor position sensor, a secondary motor position signal of the motor that is sampled at a regular rate;
estimating a second motor velocity of the motor using the secondary motor position signal that is sampled at a regular rate by computing $(\text{position}_j - \text{position}_{j-k})/(\text{time}_j - \text{time}_{j-k})$, where $\text{position}_j$ is a motor position value from the secondary motor position signal, $\text{time}_j$ is corresponding time value, $\text{position}_{j-k}$ is an older motor position value from the secondary motor position signal, and $\text{time}_{j-k}$ is corresponding time value; and
detecting an error in the first motor position sensor by comparing the motor velocity and the second motor velocity.

17. The method of claim 1, further comprising:
receiving, from a second motor position sensor, a secondary motor position signal of the motor that is sampled at a regular rate;
estimating a second motor velocity of the motor using the secondary motor position signal that is sampled at a regular rate by computing $(\text{position}_j - \text{position}_{j-k})/(\text{time}_j - \text{time}_{j-k})$, where $\text{position}_j$ is a motor position value from the secondary motor position signal, $\text{time}_j$ is corresponding time value, $\text{position}_{j-k}$ is an older motor position value from the secondary motor position signal, and $\text{time}_{j-k}$ is corresponding time value; and
detecting an error in the first motor position sensor by comparing the motor velocity and the second motor velocity.

* * * * *